United States Patent
Park

(10) Patent No.: US 10,085,338 B2
(45) Date of Patent: Sep. 25, 2018

(54) PRINTED CIRCUIT BOARD WITH FLUX RESERVOIR

(71) Applicant: Seagate Technology LLC, Cupertino, CA (US)

(72) Inventor: Kwang Hoon Park, Yongin (KR)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/863,591

(22) Filed: Sep. 24, 2015

(65) Prior Publication Data

US 2017/0094782 A1    Mar. 30, 2017

(51) Int. Cl.
| | | |
|---|---|---|
| H05K 1/02 | (2006.01) | |
| H05K 3/34 | (2006.01) | |
| H05K 1/11 | (2006.01) | |
| H05K 1/18 | (2006.01) | |
| B23K 35/36 | (2006.01) | |
| B23K 35/362 | (2006.01) | |
| B23K 35/26 | (2006.01) | |
| B23K 35/28 | (2006.01) | |
| B23K 35/30 | (2006.01) | |
| B23K 35/24 | (2006.01) | |

(52) U.S. Cl.
CPC ........ *H05K 1/0272* (2013.01); *B23K 35/24* (2013.01); *B23K 35/262* (2013.01); *B23K 35/264* (2013.01); *B23K 35/268* (2013.01); *B23K 35/282* (2013.01); *B23K 35/302* (2013.01); *B23K 35/3006* (2013.01); *B23K 35/3013* (2013.01); *B23K 35/362* (2013.01); *B23K 35/3613* (2013.01); *H05K 1/111* (2013.01); *H05K 1/181* (2013.01); *H05K 1/189* (2013.01); *H05K 3/3452* (2013.01); *H05K 3/3457* (2013.01)

(58) Field of Classification Search
CPC ...................................... H05K 1/118
USPC ............................................. 174/254
See application file for complete search history.

(56) References Cited

U.S. PATENT DOCUMENTS

| | | | |
|---|---|---|---|
| 5,172,852 A * | 12/1992 | Bernardoni | ........... H05K 1/111 228/180.21 |
| 5,414,223 A | 5/1995 | Suski et al. | |
| 6,001,707 A | 12/1999 | Lin et al. | |
| 6,084,312 A | 7/2000 | Lee | |

(Continued)

*Primary Examiner* — Hoa C Nguyen
*Assistant Examiner* — Stanley Tso
(74) *Attorney, Agent, or Firm* — Hall Estill Attorneys at Law

(57) ABSTRACT

Method and apparatus for establishing an electrical interconnection between an electrical lead and a printed circuit board (PCB), such as a PCB used in a data storage device. In some embodiments, the PCB includes a multi-layer substrate having at least one conductive layer and at least one electrically insulative layer. An electrically conductive pad is provided on a facing surface of the substrate in electrical communication with the at least one conductive layer. A flux reservoir is placed adjacent the pad which extends from the facing surface into the substrate. A solder mask layer is provided on the facing surface of the base structure which surrounds the pad and extends into the reservoir. The solder mask layer and reservoir collect liquid flux from a soldering operation used to form a solder joint between the pad and a conductive lead of an electronic component.

9 Claims, 3 Drawing Sheets

(56) References Cited

U.S. PATENT DOCUMENTS

| | | | |
|---|---|---|---|
| 6,187,610 B1 | 2/2001 | Armezzani et al. | |
| 6,382,500 B1 | 5/2002 | Master et al. | |
| 6,443,351 B1 * | 9/2002 | Huang | B23K 3/0623 |
| | | | 228/103 |
| 8,077,472 B2 | 12/2011 | Liu | |
| 8,124,520 B2 | 2/2012 | Kim et al. | |
| 8,669,777 B2 | 3/2014 | Kuah et al. | |
| 8,680,404 B2 | 3/2014 | Ryoichi et al. | |
| 2003/0061948 A1 * | 4/2003 | Coleman | H05K 3/1225 |
| | | | 101/127 |
| 2005/0173151 A1 * | 8/2005 | Shepherd | H05K 1/114 |
| | | | 174/250 |
| 2005/0217757 A1 * | 10/2005 | Miyano | B23K 35/34 |
| | | | 148/24 |
| 2006/0207790 A1 | 9/2006 | Choi | |
| 2008/0160252 A1 * | 7/2008 | Leon | H05K 1/115 |
| | | | 428/131 |
| 2011/0108716 A1 * | 5/2011 | Shiraishi | G02B 6/4249 |
| | | | 250/227.24 |
| 2015/0170995 A1 * | 6/2015 | Chen | H01L 24/11 |
| | | | 257/774 |

\* cited by examiner

PRINTED CIRCUIT BOARD WITH FLUX RESERVOIR

SUMMARY

Various embodiments of the present invention are generally directed to a method and apparatus for establishing an electrical interconnection between an electrical lead and a printed circuit board (PCB), such as but not limited to a PCB used in a data storage device.

In accordance with some embodiments, the PCB includes a multi-layer substrate having at least one conductive layer and at least one electrically insulative layer. An electrically conductive pad is provided on a facing surface of the substrate in electrical communication with the at least one conductive layer. A flux reservoir is placed adjacent the pad which extends from the facing surface into the substrate. A solder mask layer is provided on the facing surface of the base structure which surrounds the pad and extends into the reservoir. The solder mask layer and reservoir collect liquid flux from a soldering operation used to form a solder joint between the pad and a conductive lead of an electronic component.

In other embodiments, a printed circuit board assembly (PCBA) includes a printed circuit board (PCB) characterized as a multi-layer substrate comprising a conductive layer, an electrically insulative layer, an electrically conductive pad on a facing surface of the substrate in electrical communication with the conductive layer, a flux reservoir adjacent the pad which extends from the facing surface into the substrate, and a solder mask layer on the facing surface of the base structure which surrounds the pad and extends into the reservoir. An electrical component has a conductive lead supported by the PCB. A solder joint attaches the electrical component to the pad, the flux reservoir containing a volume of flux resulting from the formation of the solder joint.

In further embodiments, a method includes steps of placing an electrical component onto a printed circuit board (PCB) comprising at least one conductive layer, at least one electrically insulative layer, an electrically conductive pad on a facing surface of the PCB in electrical communication with the at least one conductive layer, a reservoir adjacent the pad which extends from the facing surface into the PCB, and a solder mask layer on the facing surface which surrounds the pad and extends into the reservoir; applying solder to at least a selected one of the pad or a conductive lead of the electrical component, the solder comprising at least one metal binding agent and a flux; and melting the solder to form a solder joint between the conductive lead and the pad, the solder mask and reservoir configured to draw and collect liquefied flux from the solder during said formation of the solder joint.

These and other features and advantages of various embodiments can be understood from a review of the following detailed description and the accompanying drawings.

DETAILED DESCRIPTION

Figure 1:
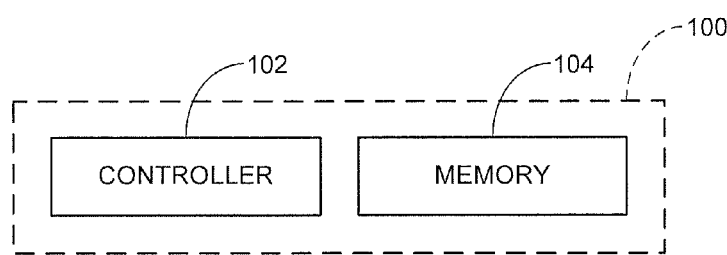
FIG. 1 provides a functional block diagram of a data storage device constructed in accordance with various embodiments of the present disclosure.

The present disclosure is generally directed to a novel printed circuit board (PCB) configuration to facilitate improved soldering connections between electronic devices and solder pads on the PCB.

As will be recognized, solder is often used to form interconnections between electrical leads and electrically conductive pads on a printed circuit board (PCB). Solder can take a variety of forms, and usually includes one or more metals such as tin and lead combined with solder flux. Solder flux may be organic or inorganic and serves to reduce oxidation of the components being soldered, to clean the surfaces of contaminants, and to reduce the surface tension of the liquid soldering material. In this way, solder flux often operates as a wetting agent to ensure good adhesion of the liquefied metal to the associated conductive surfaces.

Solder can come in a variety of forms, including a solder paste that is applied to the components and/or pads or solder "balls" which are precisely placed on the electrically conductive pads or leads. The solder is cured by using a solder reflow machine in which heat is applied to the components to activate the flux and melt the solder to form the respective solder joints.

While operable, a limitation associated with the use of solder flux is the fact that most solder fluxes leave a residue at the end of a solder reflow operation in which the solder is heated to allow the solder to melt and solidify to form a hardened solder joint. Leaving solder flux in place can result in the attraction of contaminants, corrosion, current leakage, etc. For these reasons, the flux residue is usually cleaned from the solder joint and surrounding area. This often requires a manual process that can increase processing costs and inadvertently induce damage to the assembled components.

Accordingly, various embodiments of the present disclosure are generally directed to an improved PCB fabrication process. As explained below, various embodiments utilize a PCB with an electrically conductive pad surrounded by a solder mask formed from a suitable electrically insulative, nonwettable material, such as a polymer layer. The solder mask is configured to prevent inadvertent attachment of solder during a solder reflow process to an adjacent pad or other nearby component (trace, component lead, etc.).

A flux collection reservoir ("drain") is formed contiguously with the solder mask and extends into the PCB to collect liquid flux from the soldering operation. In this way, the flux drains from the vicinity of the solder joint, reducing the occurrence of solder flux, and reducing or eliminating the need for a secondary cleaning operation.

In some embodiments, the drain is configured as a via, or plated-thru-hole (PTH) adjacent the solder mask, except that the hole is coated with the solder mask material which surrounds the electrical pad and provides a path for the flux to flow into the hole. In this way, the hole can be characterized as a non-plated-thru-hole (NPTH). An NPTH is particularly suitable as a reservoir to hold the flux, since the flux drains into the hole and solidifies in place out of the way during subsequent use of the PCB.

While the solder mask is contemplated as being planar, other shapes are contemplated including shapes that further urge the flux into the reservoir. It has been found by the inventors that the actual shape (top plan profile) of the solder mask can facilitate efficient draining of the flux from the vicinity of the solder joint to the reservoir.

These and other features and advantages of various embodiments can be understood beginning with a review of FIG. 1 which provides a functional block representation of a data storage device 100 in accordance with some embodiments.

The data storage device 100 includes a top level controller 102 and a memory module 104. The controller 102 can take the form of a hardware or programmable processor with associated programming in memory to provide top level control of the device 100. The memory module 104 provides non-volatile memory storage of data supplied by a host device such as a personal computer, tablet or other electronic device. The memory may take the form of rotatable magnetic recording discs, solid-state memory, etc.

Figure 2:
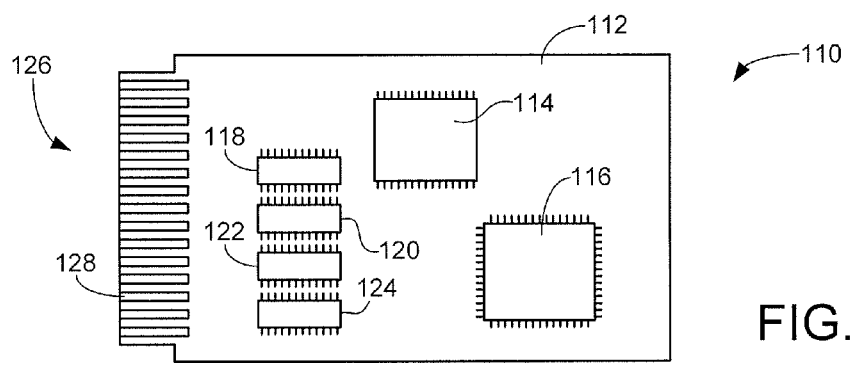
FIG. 2 depicts an exemplary rigid printed circuit board (PCB) constructed in accordance with some embodiments.

FIG. 2 shows an exemplary printed circuit board assembly (PCBA) 110 that may be incorporated into the data storage device 100 of FIG. 1. The PCBA 110 incorporates a rigid printed circuit board (PCB) 112 formed of a lamination of various conductive and insulative layers. A number of integrated circuits (ICs) 114, 116, 118, 120, 122 and 124 are attached to, and supported by, the PCB 112. The ICs incorporate various hardware and/or programmable elements to provide functionality utilized by the storage device 100, and include electrical leads that are attached to corresponding electrically conductive pads of the PCB 112 in a manner discussed below. An edge connector 126 includes electrically conductive contacts 128 to enable communication of the storage device 100 with a surrounding environment.

Figure 3:
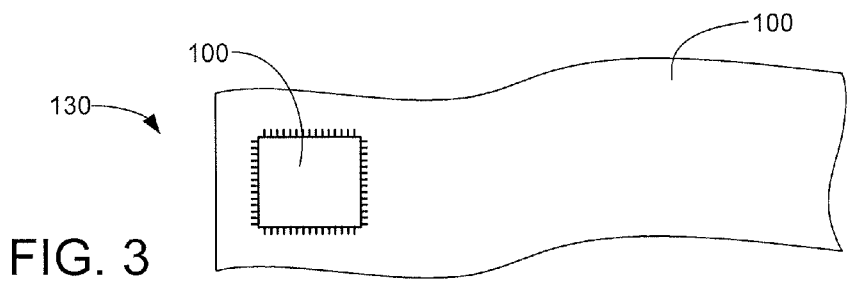
FIG. 3 depicts an exemplary flexible PCB in accordance with some embodiments.

FIG. 3 shows another exemplary PCBA 130 that may be incorporated into the data storage device 100 of FIG. 1. The PCBA 130 of FIG. 3 utilizes a flexible PCB 132 as a multi-layer flexible substrate formed of a lamination of various conductive and insulative layers. Unlike the substantially rigid PCBA of FIG. 2, the flexible PCBA 130 of FIG. 3 may, for example, enable the establishment of electrical interconnection with a moveable actuator used to position one or more data transducers (heads) adjacent rotatable magnetic recording media. The flexible PCBA 130 is shown to include an IC 134 affixed to the flexible PCB substrate 132. The IC 134 may take the form of a preamplifier/driver (preamp) circuit configured to be mounted to a side of a moveable actuator assembly. Other components (not shown) may also be attached to the flexible PCB as required.

Figure 4:
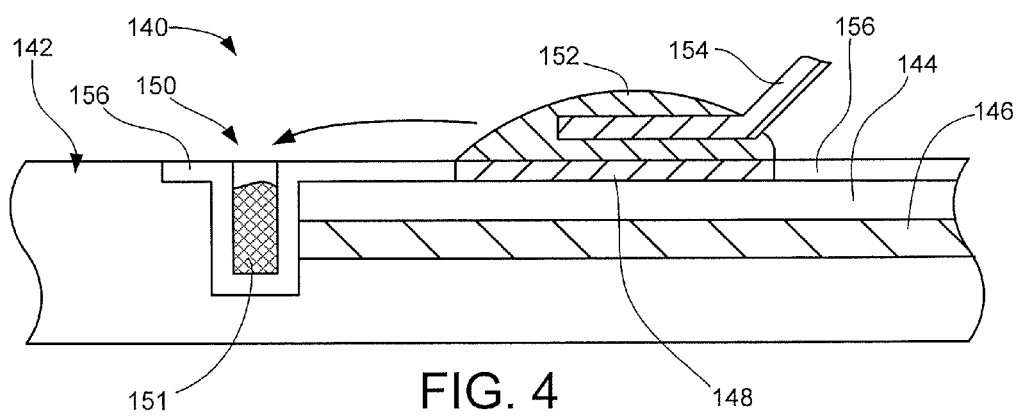
FIG. 4 is a cross-sectional, elevational view of a PCB constructed in accordance with some embodiments.

FIG. 4 is a cross-sectional, elevational view of another PCBA 140 that can be incorporated into the device 100 of FIG. 1 in some embodiments. The PCBA 140 may use a rigid PCB as in FIG. 2 or a flexible PCB as in FIG. 3. The PCBA 140 includes a multi-layer PCB substrate 142 with at least one electrically insulative layer 144 and at least one electrically conductive layer 146. An electrically conductive pad 148 is formed on a top surface of the substrate 142. The pad 148 may be in contact with the embedded conductive layer 146 by way of one or more electrical interconnections (not shown), such as a via (plated-through hole, or PTH).

A flux reservoir is depicted at 150. The flux reservoir 150 extends into the thickness of the PCB substrate 142 to collect flux residue 151 from a solder joint 152 used to bond an electrical lead 154 of an electrical component (such as depicted in FIGS. 2-3) to the pad 148. A solder mask 156 surrounds the pad 148 and coats at least a portion of the flux reservoir 150.

While not limiting, the solder mask 156 is formed of a suitable insulative non-wetting material so that the metal and flux components of the solder tend to not adhere to the solder mask material. The solder mask (solder resist) may be a thin layer of lacquer or polymer applied to the PCB to provide protection against oxidation and to prevent solder bridges (e.g., unintended solder bridges) from forming between closely spaced solder pads. The solder masks and other features of the PCBs may be formed using conventional PCB fabrication techniques such as photolithography, silk-screening, etc. The solder mask may be formed using liquid photoimageable solder mask (LPSM), dry film solder mask (DFSM), silk-screening, spray masking, vacuum lamination, etc.

Generally, during a solder reflow operation, the flux residue 151 of the solder will tend to flow toward and collect in the reservoir 150. In this way, the presence of solder flux residue will be reduced, reducing the propensity of the assembly to have a failure path due to contamination, short circuits or other effects resulting from the presence of a large amount of flux residue in the vicinity of the solder joint 152.

Figure 5A:
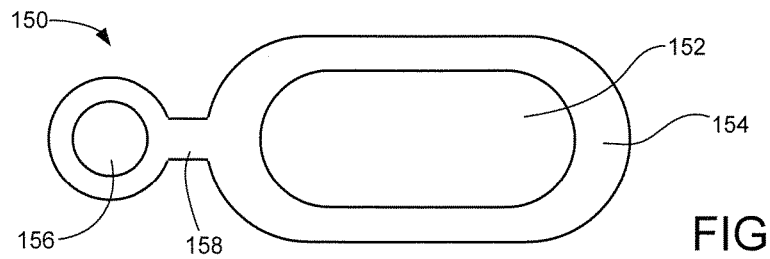
FIGS. 5A-5D show different pad and flux reservoir configurations for PCBs depicted in FIGS. 2-4.

FIGS. 5A-5D provide various alternative configurations of solder pads and flux reservoirs that may be incorporated into the PCBs of FIGS. 2-3 as desired. FIG. 5A shows a first configuration 150 in which an electrically conductive pad 152 is surrounded by a solder mask 154. A flux reservoir 156 collects liquefied flux material, and a narrow, elongated neck portion 158 of the solder mask material adjoins the pad 152 to the flux reservoir 158 to facilitate the flow and collection of the liquefied flux material into the reservoir.

Figure 5B:
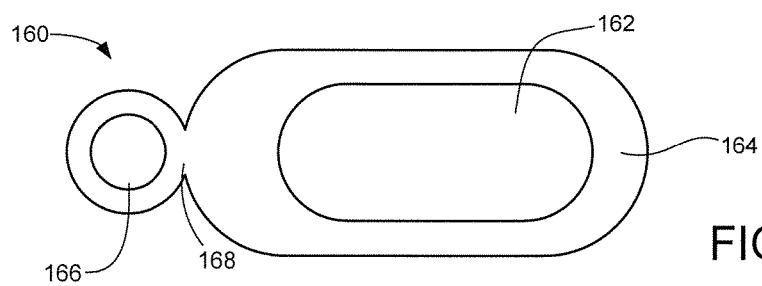

FIG. 5B shows a second configuration 160 in which an electrically conductive pad 162 is surrounded by a solder mask 164. As before, a flux reservoir 166 collects liquefied flux material. In FIG. 5B, the solder mask adjoins the respective pad 162 and reservoir 166 using a shortened neck portion 168.

Figure 5C:
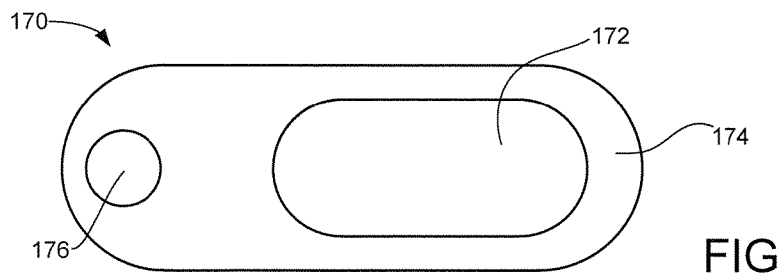

FIG. 5C is a third configuration 170 in which an electrically conductive pad 172 is surrounded by a solder mask 174. In this case, the solder mask maintains a width dimension to surround an adjacent flux reservoir 176.

Figure 5D:
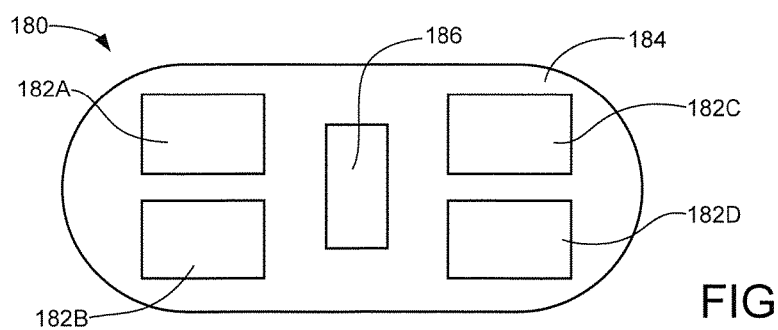

FIG. 5D is a fourth configuration 180 with a plurality of conductive pads 182A, 182B, 182C and 182D which are surrounded by a continuous solder pad 184. A centrally located flux reservoir 186 is configured to collect liquefied flux from soldering operations associated with each of the pads.

From FIGS. 5A-5D it can be seen that the particular shapes of the solder masks, pads and reservoirs can be modified as required to best facilitate drainage of the liquefied flux residue into the associated reservoir(s).

Figure 6:
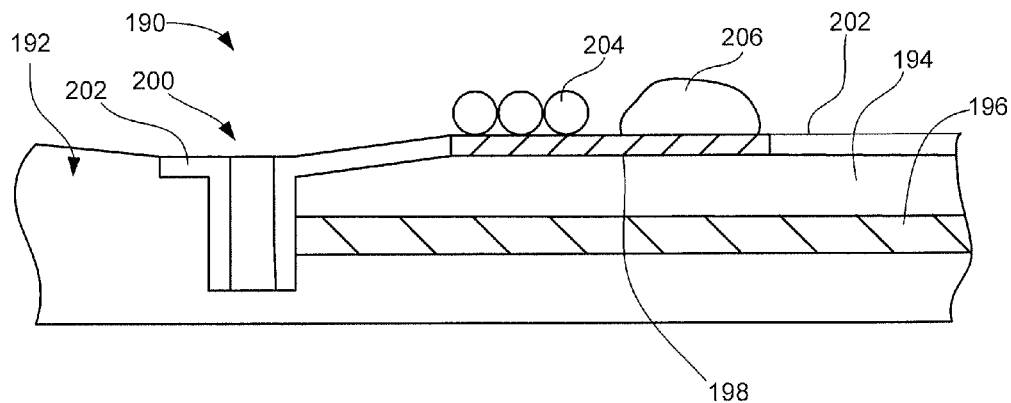
FIG. 6 illustrates the application of solder to a conductive pad in accordance with some embodiments.

It is contemplated that the various layers of the associated PCB will be planar (e.g., parallel to a horizontal reference). In other embodiments, the PCB may be configured to facilitate flow of the liquefied flux residue to the associated reservoir by providing a non-horizontal (sloped) drainage path. FIG. 6 illustrates another PCB 190 in accordance with some embodiments. The PCB 190 includes a multi-layer substrate 192 which may be rigid or flexible as before. The substrate 192 includes at least one embedded conductive layer 194 and at least one insulative layer 196. A conductive pad 198 is formed on the insulative layer 196 as shown.

A flux reservoir 200 extends into a thickness direction of the substrate 192 and is adapted to collect liquefied flux residue. A solder mask 202 surrounds at least a portion of the pad 198 and coats at least a portion of the flux reservoir 200. As shown in FIG. 6, the solder mask 202 may coat less than all of the interior surfaces of the reservoir 200. The coating of at least a portion of the side of the reservoir helps to ensure flow of the liquefied flux into the reservoir. The solder mask 202 is contoured to provide a sloped surface relative to the horizontal plane to facilitate a flow of the liquefied flux residue into the reservoir.

During a fabrication process, solder may be provided adjacent the pad 198 in any number of suitable forms, such as in the form of solder balls 204 or solder paste 206. Any number of solder compositions may be utilized, including but not limited to alloys of tin (Sn), lead (Pb), copper (Cu), silver (Ag), bismuth (Bi), indium (In), zinc (Zn), gold (Au) and/or antimony (Sb). Fluxes may be organic or inorganic and may include resins, amine compounds, epoxies, carboxyl group compounds, acids or other suitable materials to provide wetting, cleaning and oxide prevention properties.

Figure 7:
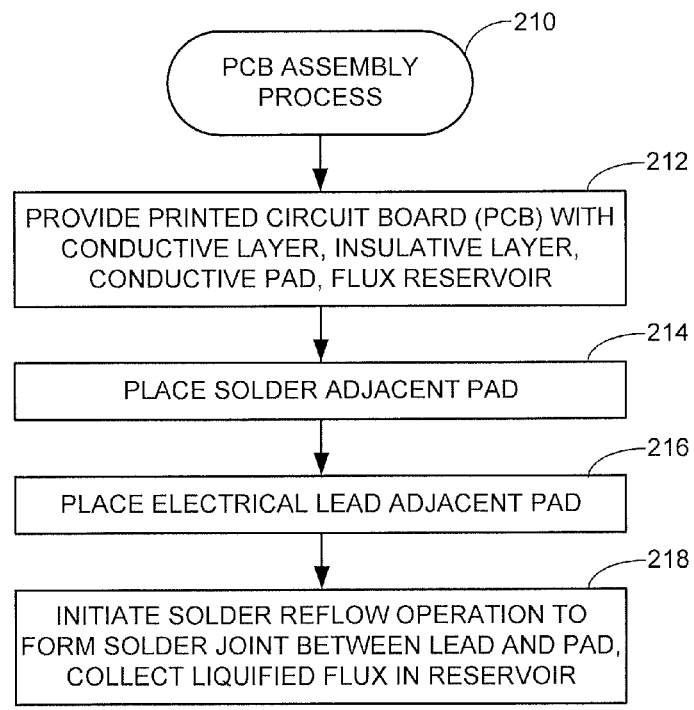
FIG. 7 is a flow chart for a PCB assembly routine to illustrate steps carried out in accordance with some embodiments.

FIG. 7 is a flow chart for a PCB assembly process routine 210 carried out in accordance with some embodiments. A printed circuit board (PCB) is provided at step 212 having at least one conductive layer, at least one insulative layer, at least one conductive pad and at least one flux reservoir adjacent the conductive pad. Solder is placed adjacent the pad at step 214, and an electrical lead is placed adjacent the pad at step 216. These steps may be reversed as required such that the lead is placed adjacent the pad followed by the application of the solder, as required.

The assembly is thereafter subjected to a solder reflow operation at step 218 wherein heat is applied to melt the solder and initiate a solder reflow operation to form a solder joint between the electrical lead and the pad. The liquefied flux component of the solder flows and collects in the adjacent flux reservoir.

The various embodiments disclosed herein are suitable for use in a number of different electronic fabrication processes, including but not limited to those associated with printed circuit boards used in data storage devices such as hard disc drives (HDDs) and solid state drives (SSDs). The various embodiments can be utilized in surface mount technology (SMT) and through hole configurations. Reflow operations in the range of about 200-400 degrees Celsius can be applied using reflow equipment or other mechanisms.

The flux reservoirs disclosed herein can eliminate the need to apply post-reflow cleaning processes, including those that employ brushes or other mechanisms to reduce the presence of flux residue adjacent various solder joints and pads. A capillary operation draws the liquefied flux into the respective reservoir(s). The reservoirs can take substantially any suitable size or shape, including "pockets" or depressions in the solder mask.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A printed circuit board (PCB) comprising:
a multi-layer substrate having at least one conductive layer and at least one electrically insulative layer;
an electrically conductive pad on a facing surface of the substrate in electrical communication with the at least one conductive layer,
the pad having a side surface extending in a direction away from the facing surface
and a top surface nominally parallel to the substrate and disposed a selected distance from the facing surface;
a flux reservoir adjacent the pad which extends from the facing surface into the substrate; and
a solder mask layer on the facing surface of the substrate which surrounds the pad in contacting relation to the side surface of the pad and which extends into the reservoir,
the solder mask layer having a top surface aligned with the top surface of the pad and disposed at the selected distance from the facing surface,
the solder mask layer and reservoir configured to collect liquid flux responsive to a soldering operation used to form a solder joint between the pad and a conductive lead of an electronic component,
the flux reservoir characterized as a non-plated-through hole (NPTH) having a sidewall and a bottom surface,
the sidewall and the bottom surface of the NPTH coated by the solder mask layer,
and the solder mask layer having a first width adjacent the pad,
a second width adjacent the flux reservoir,
and a narrow neck portion having a third width less than the first and second widths between the pad and the flux reservoir.

2. The PCB of claim 1, wherein the PCB is a rigid PCB.

3. The PCB of claim 1, wherein the PCB is a flexible PCB.

4. The PCB of claim 1, wherein the solder mask layer is sloped in a direction toward the flux reservoir.

5. The PCB of claim 1, characterized as a PCB of a data storage device.

6. The PCB of claim 1, in combination with the electrical component attached thereto by way of the solder joint attaching the conductive lead to the pad.

7. A printed circuit board assembly (PCBA), comprising:
a printed circuit board (PCB) characterized as a multi-layer substrate comprising a conductive layer,
an electrically insulative layer,
an electrically conductive pad on a facing surface of the substrate in electrical communication with the conductive layer,
a flux reservoir adjacent the pad which extends from the facing surface into the substrate, and a solder mask layer on the facing surface of the substrate which surrounds the pad and extends into the reservoir,
the electrically conductive pad having a top surface nominally parallel to the facing surface and a side surface nominally perpendicular to the facing surface,
the solder mask layer contactingly abutting the side surface of the pad and having a top layer aligned with the top layer of the pad;
an electrical component having a conductive lead supported by the PCB;
and a solder joint which attaches the electrical component to the pad,
the flux reservoir containing a volume of flux resulting from the formation of the solder joint,
the flux reservoir characterized as a non-plated-through hole (NPTH) having a sidewall and a bottom surface,
the sidewall and the bottom surface of the NPTH coated by the solder mask layer, and the solder mask layer having a first width adjacent the pad,
a second width adjacent the flux reservoir,
and a narrow neck portion having a third width less than the first and second widths between the pad and the flux reservoir.

8. The PCBA of claim 7, wherein the solder mask layer is sloped in a direction toward the flux reservoir.

9. The PCBA of claim 7, wherein the solder comprises a metal alloy and a flux, the metal alloy comprising at least a selected one of tin (Sn), lead (Pb), copper (Cu), silver (Ag), bismuth (Bi), indium (In), zinc (Zn), gold (Au) or antimony (Sb), the flux comprising at least a selected one of a resin, an amine compound, an epoxy, a carboxyl group compound, or an acid.

* * * * *